(12) United States Patent
Wu et al.

(10) Patent No.: US 7,008,476 B2
(45) Date of Patent: Mar. 7, 2006

(54) MODIFIED ALGINIC ACID OF ALGINIC ACID DERIVATIVES AND THERMOSETTING ANTI-REFLECTIVE COMPOSITIONS THEREOF

(75) Inventors: Hengpeng Wu, Hillsborough, NJ (US);
Zhong Xhiang, Somerset, NJ (US);
Shuji Ding-Lee, Branchburg, NJ (US);
Jianhui Shan, Pennington, NJ (US);
Eleazar B. Gonzalez, Bloomfield, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 10/459,229

(22) Filed: Jun. 11, 2003

(65) Prior Publication Data

US 2004/0253532 A1 Dec. 16, 2004

(51) Int. Cl.
*G03F 7/11* (2006.01)
*C08L 5/04* (2006.01)
*C08B 37/04* (2006.01)

(52) U.S. Cl. .................. 106/162.1; 536/3; 430/271.1; 525/54.3; 525/54.2; 516/104

(58) Field of Classification Search ........ 430/269–331; 525/54.3, 54.2; 536/3; 106/162.1; 516/104
See application file for complete search history.

(56) References Cited

U.S. PATENT DOCUMENTS

| 2,798,098 | A | * | 7/1957 | Linn ........................... 516/104 |
| 3,128,314 | A | * | 4/1964 | Shen et al. .................. 252/392 |
| 3,647,446 | A | * | 3/1972 | Alsup et al. ................. 522/149 |
| 3,748,131 | A | * | 7/1973 | Reynolds et al. ........... 522/149 |
| 3,879,356 | A | * | 4/1975 | Pacifici ..................... 430/271.1 |
| 4,077,806 | A | * | 3/1978 | Muzyczko et al. ......... 526/265 |
| 4,435,489 | A | * | 3/1984 | Muller et al. ............... 524/236 |
| 4,575,399 | A |   | 3/1986 | Tanaka et al. |
| 5,264,422 | A | * | 11/1993 | della Valle et al. ........... 514/26 |
| 5,401,614 | A |   | 3/1995 | Dichiara et al. ............. 430/323 |
| 5,482,817 | A |   | 1/1996 | Dichiara et al. ......... 430/271.1 |
| 5,597,868 | A |   | 1/1997 | Kunz .......................... 525/154 |
| 5,639,865 | A | * | 6/1997 | Kalbe et al. ................ 536/18.5 |
| 5,652,297 | A |   | 7/1997 | McCulloch et al. ......... 524/555 |
| 5,652,317 | A |   | 7/1997 | McCulloch et al. ......... 430/435 |
| 5,693,691 | A |   | 12/1997 | Flaim et al. .............. 430/271.1 |
| 5,846,530 | A | * | 12/1998 | Soon-Shiong et al. ..... 424/93.7 |
| 5,919,599 | A |   | 7/1999 | Meador et al. ........... 430/271.1 |
| 5,935,760 | A |   | 8/1999 | Shao et al. ............... 430/271.1 |
| 5,977,348 | A | * | 11/1999 | Harris et al. ................. 536/107 |
| 6,316,160 | B1 |   | 11/2001 | Shao et al. ............... 430/271.1 |
| 6,362,330 | B1 | * | 3/2002 | Simon et al. ............... 525/54.2 |
| 2003/0198599 | A1 | * | 10/2003 | Yalpani .......................... 536/3 |

FOREIGN PATENT DOCUMENTS

| EP | 0 251 905 A2 | * | 1/1988 |
| EP | 251905 | | 1/1988 |
| EP | 0251905 | | 1/1988 |
| EP | 542008 | | 5/1993 |
| EP | 636941 | | 2/1995 |
| GB | 676618 | | 7/1952 |
| JP | 54-042478 | | 4/1979 |
| JP | 60-219202 | | 11/1985 |
| WO | WO-98/12228 A1 | * | 3/1998 |

OTHER PUBLICATIONS

Form PCT/ISA/210 for PCT/EP2004/005654.
Form PCT/ISA/220 for PCT/EP2004/005654.
Form PCT/ISA/237 for PCT/EP2004/005654.
English language translation of the abstract for JP 54-042478.
English language translation of the abstract for JP 60-219202.
Zhong Xiang et al., "Optimization of Organic Bottom Antireflective Coatings' Compatibility with ArF Resist", Proceedings of SPIE, vol. 4690, 2002, pp. 1102-1111.
Y.-H. Kang, "Development of bottom antireflective coating for high-resolution KrF lithography", Proceedings of SPIE, vol. 4690, 2002, pp. 1093-1101.
English language Translation of abstract for JP 60-219202.

* cited by examiner

*Primary Examiner*—Cynthia Hamilton
(74) *Attorney, Agent, or Firm*—Alan P. Kass

(57) ABSTRACT

Modified alginic acid or alginic acid derivatives and antireflective coatings based on thereon are described.

12 Claims, No Drawings

US 7,008,476 B2

MODIFIED ALGINIC ACID OF ALGINIC ACID DERIVATIVES AND THERMOSETTING ANTI-REFLECTIVE COMPOSITIONS THEREOF

FIELD OF THE INVENTION

This invention relates to modified alginic acid or alginic acid derivatives and anti-reflective coating compositions thereof useful in multilayer photoresist processes.

BACKGROUND OF THE INVENTION

The present invention relates to novel modified alginic acid or alginic acid derivatives and anti-reflective coating compositions thereof and their use in image processing by forming a thin layer between a reflective substrate and a photoresist coating. Such compositions are especially useful in the fabrication of semiconductor devices by photolithographic techniques.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has lead to the use of sophisticated multilevel systems to overcome difficulties associated with such miniaturization. The use of highly absorbing anti-reflective coatings in photolithography is a simpler approach to diminish the problems that result from back reflection of light from highly reflective substrates. Two deleterious effects of back reflectivity are thin film interference and reflective notching. Thin film interference results in changes in critical linewidth dimensions caused by variations in the total light intensity in the resist film as the thickness of the resist changes. Variations of linewidth are proportional to the swing ratio (S) and therefore must be minimized for better linewidth control. Swing ratio is defined as $$S=4(R_1 R_2)^{1/2} e^{-\alpha D}$$

where $R_1$ is the reflectivity at the resist/air or resist/top coat interface, where $R_2$ is the reflectivity at the resist/substrate interface, where $\alpha$ is the resist optical absorption coefficient, and D is the film thickness.

Bottom anti-reflective coatings function by absorbing the radiation used for exposing the photoresist, thus reducing $R_2$ and thereby reducing the swing ratio. Reflective notching becomes severe as the photoresist is patterned over substrates containing topographical features, which scatter light through the photoresist film, leading to linewidth variations, and in the extreme case, forming regions with complete resist loss. Similarly, dyed top anti-reflective coatings reduce the swing ratio by reducing $R_1$, where the coating has the optimal values for refractive index and absorption characteristics, such as absorbing wavelength and intensity.

In the past, dyed photoresists have been utilized to solve these reflectivity problems. However, it is generally known that dyed resists only reduce reflectivity from the substrate but do not substantially eliminate it. In addition, dyed resists also cause reduction in the lithographic performance of the photoresist, together with possible sublimation of the dye and incompatibility of the dye in resist films. In cases where further reduction or elimination of the swing ratio is required, the use of a bottom anti-reflective coating provides the best solution for reflectivity. The bottom anti-reflective coating is applied to the substrate prior to coating with the photoresist and prior to exposure. The resist is exposed image-wise and developed. The anti-reflective coating in the exposed area is then etched, typically in an oxygen plasma, and the resist pattern is thus transferred to the substrate. The etch rate of the anti-reflective film should be relatively high in comparison to the photoresist so that the anti-reflective film is etched without excessive loss of the resist film during the etch process.

Anti-reflective coatings containing a dye for absorption of the light and an organic polymer to give coating properties are known. However, the possibility of sublimation and diffusion of the dye into the environment and into the photoresist layer during heating make these types of anti-reflective compositions undesirable.

Polymeric organic anti-reflective coatings are known in the art but are typically cast from organic solvents, such as cyclohexanone and cyclopentanone. The potential hazards of working with such organic solvents, have lead to the development of the anti-reflective coating composition of the instant invention, where the solid components of the anti-reflective coating are both soluble and spin castable from solvents having lesser toxicity hazards. However, the novel dye functionality of the instant invention when attached to the specific types of monomer described, makes the instant invention significantly different from the prior art referred to previously. Another advantage of using anti-reflective coatings soluble in lower toxicity solvents is that these same solvents can also be used to remove the edge bead of the anti-reflective coating and no additional hazards or equipment expense is incurred, since these solvents are also used for photoresist and photoresist processing. The anti-reflective coating composition also has good solution stability. Additionally, substantially no intermixing is present between the anti-reflective coating and the photoresist film. The anti-reflective coatings also has good dry etching properties, which enable a good image transfer from the resist to the substrate and good absorption characteristics to prevent reflective notching and linewidth variations.

Various dye-attached, thermosetting binder chemistries have been developed. They include phenolic binders such as those described in U.S. Pat. No. 5,597,868 to Kunz; acrylic binders such as those described in European Patent Published Application EP 636941 to Urano et al., European Patent Published Application EP 542008 to Thackeray, U.S. Pat. Nos. 5,652,297 and 5,652,297 to McCulloch et al., and U.S. Pat. No. 5,919,599 to Meador et al.; modified epoxy resin binders such as those described in U.S. Pat. No. 5,693,691 to Flaim et al.; aliphatic polyester binders such as those described in U.S. Pat. No. 5,935,760 to Shao et al.; polysilane binders such as those described in U.S. Pat. No. 5,401,614 to Dichiara et al.; and vinyl aromatic binders such as those described in U.S. Pat. No. 5,482,817 to Dichiara et al., all of which are incorporated herein by reference. A recent disclosure describes thermosetting anti-reflective coatings derived from cellulosic binders. See U.S. Pat. No. 6,316,160. Alkylene glycol esters of alginic acid, described as useful emulsifying agents in oil in water emulsions, are described in GB 676,618. Esters of alginic acid, described where all or only some (90 to 100 percent) of the carboxylic groups of the acid are esterified, and the salts of the partial esters with metals or organic bases which are acceptable from a pharmacological point of view are described in EP 251905.

SUMMARY OF THE INVENTION

The present invention relates to solvent soluble alginic acid or alginic acid derivatives modified with a light-absorbing compound so as to leave sufficient hydroxyl and/or carboxyl groups on the alginic acid or alginic acid derivatives for crosslinking with a crosslinking compound. Examples of the alginic acid derivatives include acetyl alginate and 1,2-propanediol ester of alginic acid. Examples of the light absorbing compound include ultraviolet light-absorbing dyes. Other examples of light absorbing compounds include aromatic alcohols, alkylating agents, aromatic oxides, aromatic anhydrides and aromatic acid halides.

The alginic acid or alginic acid derivatives can be modified with a light-absorbing compound by (1) esterifying COOH groups of the alginic acid or alginic acid derivatives with aromatic alcohol; (2) first converting the alginic acid or alginic acid derivatives to quaternary ammonium salts and then reacting those salts with an alkylating agent; (3) esterifying COOH groups of the alginic acid or alginic acid derivatives with aromatic oxide; (4) reacting OH groups of the alginic acid or alginic acid derivatives with aromatic anhydride; or (5) reacting OH groups of the alginic acid or alginic acid derivatives with aromatic acid halide.

The present invention also relates to compositions useful as, for example, bottom anti-reflective coatings, comprising the alginic acid or alginic acid derivatives modified with a light absorbing compound and at least one crosslinking agent. The composition can further comprise one or more other optional materials typically found in such compositions, such as, for example, cross-linking catalysts (for example, thermal acid generators, acids, and mixtures thereof, and the like), solvents, surfactants, solvent soluble dyes, and the like.

The invention further comprises a process for forming an image on a substrate. The substrate is coated with a film of a composition comprising the modified alginic acid or alginic acid derivatives of the instant invention and heated to remove any residual solvent and to insolubilize the coating. A film from a photoresist solution is then formed on top of the coating and further heated to substantially remove the photoresist solvent. The photoresist film is image-wise exposed through a mask with ultraviolet radiation ranging from about 150 nm to about 450 nm and processed in an aqueous alkaline developer to give a photoresist pattern. The substrate may be heated prior to and after the development step to give an image of superior quality. The exposed anti-reflective film can then be dry etched, usually in an oxygen-containing plasma, with the photoresist pattern acting as an etch mask.

DETAILED DESCRIPTION OF THE INVENTION

The present invention relates to solvent soluble alginic acid or alginic acid derivatives modified with a light-absorbing compound so as to leave sufficient hydroxyl and/or carboxyl groups on the alginic acid or alginic acid derivatives for crosslinking with a crosslinking compound. Examples of the alginic acid derivatives include acetyl alginate and 1,2-propanediol ester of alginic acid. Examples of the light absorbing compound include ultraviolet light-absorbing dyes. Other examples of light absorbing compounds include aromatic alcohols, alkylating agents, aromatic oxides, aromatic anhydrides and aromatic acid halides.

The alginic acid or alginic acid derivatives can be modified with a light-absorbing compound by (1) esterifying COOH groups of the alginic acid or alginic acid derivatives with aromatic alcohol; (2) first converting the alginic acid or alginic acid derivatives to quaternary ammonium salts and then reacting those salts with an alkylating agent; (3) esterifying COOH groups of the alginic acid or alginic acid derivatives with aromatic oxide; (4) reacting OH groups of the alginic acid or alginic acid derivatives with aromatic anhydride; or (5) reacting OH groups of the alginic acid or alginic acid derivatives with aromatic acid halide.

The present invention also relates to compositions useful as, for example, bottom anti-reflective coatings, comprising the alginic acid or alginic acid derivatives modified with a light absorbing compound and at least one crosslinking agent. The composition can further comprise one or more other optional materials typically found in such compositions, such as, for example, cross-linking catalysts (for example, thermal acid generators, acids, and mixtures thereof and the like), solvents, surfactants, solvent soluble dyes, and the like.

The invention further comprises a process for forming an image on a substrate. The substrate is coated with a film of a composition comprising the modified alginic acid or alginic acid derivatives of the instant invention and heated to remove any residual solvent and to insolubilize the coating. A film from a photoresist solution is then formed on top of the coating and further heated to substantially remove the photoresist solvent. The photoresist film is image-wise exposed through a mask with ultraviolet radiation ranging from about 150 nm to about 450 nm and processed in an aqueous alkaline developer to give a photoresist pattern. The substrate may be heated prior to and after the development step to give an image of superior quality. The exposed anti-reflective film can then be dry etched, usually in an oxygen-containing plasma, with the photoresist pattern acting as an etch mask.

Alginic Acid and Alginic Acid Derivatives

Alginic acid is a polysaccharide and exists as homopolymers or mixed sequence polymers of two types of uronic acid—mannuronic acid (if a homopolymer, also known as an M block) and guluronic acid (if a homopolymer, also known as a G block). The mixed sequence polymers are typically known as MG blocks. Alginic acid is a natural acidic polysaccharide extracted from so-called brown algae (Phaecophyceae) with a high molecular weight varying between about 30,000 and 200,000 or higher, and containing chains formed by D-mannuronic acid and L-guluronic acid. The degree of polymerization varies according to the type of alga used for extraction, the season in which the algae were gathered and the place of origin of the algae, as well as the age of the plant itself. The main species of brown algae used to obtain alginic acid are, for example, *Macrocystis pyrifera, Laminaria cloustoni, Laminaria hyperborea, Laminaria flexicaulis, Laminaria digitata, Ascophyllum nodosum*, and *Fucus serratus*. Alginic acid has the generalize formula:

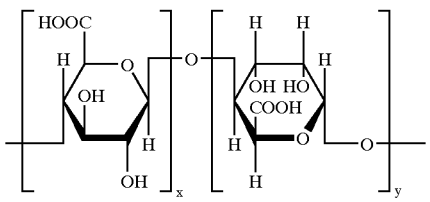

Alginic acid has both hydroxyl and carboxyl groups in the structure. As such, there are reactive sites to react onto which certain moieties, for example, light absorbing dyes, can be attached. Alginic acid can be used as is or any salts of alginic acid which can be converted into alginic acid can be used as starting material for the purposes of this invention.

Other alginic acid derivatives, for example, acetyl alginate, can also be used as starting materials for dye-attaching reactions. Acetyl alginate can be prepared by reacting alginic acid with an acid anhydride (e.g., acetic anhydride) in the presence of a catalytic amount of strong acid (for example, sulfuric acid). Another alginic acid derivative suitable for dye-attaching reactions is commercially available propylene glycol alginate (1,2-propanediol ester of alginic acid).

Examples of the light absorbing compound include ultra-violet light-absorbing dyes. Other examples of light absorbing compounds include aromatic alcohols, alkylating agents, aromatic oxides, aromatic anhydrides and aromatic acid halides, examples of which are listed below.

The following are examples of some typical methods of attaching light absorbing compounds to alginic acid or alginic acid derivatives and is not intended to be exclusive.

Light absorbing compounds can be attached to alginic acid or alginic acid derivatives through either the COOH groups and/or the OH groups on the polymer:

1. Simple esterfication of COOH groups with aromatic alcohols (preferred: primary or secondary aromatic alcohols); for example, acid-catalyzed esterfication with aromatic alcohols. Examples of aromatic alcohols include benzyl alcohol, sec-phenethyl alcohol, 2-phenyl-2-propanol, benzhydrol, 4-biphenylmethanol, 1-(or 2-)naphthol, 9-anthracenemethanol, alpha-(trifluoromethyl)benzyl alcohol, 1,2-diphenyl-2-propanol, 2-halo(chloro, fluoro, bromo, iodo)-1-phenylethanol, 1-phenyl-1-propanol, 2-methyl-1-phenyl-1-propanol, 2,2-dimethyl-1-phenyl-1-propanol, 3-halo(chloro, fluoro, bromo, iodo)-1-phenyl-1-propanol, 2-phenyl-1,2-propanediol, 2,2-dimethyl-1-pheny-1,3-propanediol, 1-phenyl-1-butanol, 1-phenyl-1-decanol, alpha-cyclopropylbenzyl alcohol, cyclopropyldiphenylmethanol, 2-phenyl-1-cyclohexanol, hydrobenzoin, 1,1-diphenylethanol, triphenylmethanol, 2-phenethylbenzyl alcohol, benzopinacole, 1,1,1,3,3,3-hexahalo(chloro, fluoro, bromo, iodo)-2-phenyl-2-propanol, 2-(or 3- or 4-)$C_{1-10}$ straight or branched chain alkyl(e.g., methyl, ethyl, propyl, butyl, sec-butyl, tert-butyl, pentyl, hexyl, heptyl, and the like etc)benzyl alcohol, 2-(or 3- or 4-) halo(chloro, fluoro, bromo, iodo) benzyl alcohol, 2-(or 3- or 4-)(trifluoromethyl)benzyl alcohol, 2-(or 3- or 4-)hydroxybenzyl alcohol, 2-(or 3- or 4-)$C_{1-10}$ straight or branched chain alkoxy(e.g., methoxy, ethoxy, propoxy, butoxy, hexyloxy, heptyloxy, and the like etc)benzyl alcohol, 2-(or 3- or 4-) halo(chloro, fluoro, bromo, iodo)-alpha-methylbenzyl alcohol, 2-(or 3- or 4-)$C_{1-10}$ straight or branched chain alkoxy(e.g., methoxy, ethoxy, propoxy, butoxy, hexyloxy, heptyloxy, and the like etc)-alpha-methylbenzyl alcohol, 1,2-benzenedimenthol, 3-(trifluoromethyl)benzyl alcohol, 3-methylbenzyl alcohol, 2-halo(chloro, fluoro, bromo, iodo)benzyl alcohol, 1-(or 2-)naphthalenemethanol, 9-hydroxyanthene, 2,2'-(1,2-phenylenedioxy)diethanol, 3,5-dimethoxybenzyl alcohol, 3-(or 4-)benzyloxybenzyl alcohol, alpha-methyl-2-naphthalenemethanol, 3,3-diphenyl-1-propanol, 2,2-diphenylethanol, 2-benzyloxyethanol, 1-phenyl-1,2-ethanediol, 2-methoxy-2-phenylethanol, 2-(or 3- or 4-)methylphenethyl alcohol, 3-methoxyphenethyl alcohol, 3-phenylglycidol, 2-methyl-3-phenylglycidol, etc.

As used herein, for example, 2-(or 3- or 4-)halo(chloro, fluoro, bromo, iodo)benzyl alcohol means 2-chlorobenzyl alcohol, 2-fluorobenzyl alcohol, 2-bromobenzyl alcohol, and 2-iodobenzyl alcohol; 3-chlorobenzyl alcohol, 3-fluorobenzyl alcohol, 3-bromobenzyl alcohol, and 3-iodobenzyl alcohol; 4-chlorobenzyl alcohol, 4-fluorobenzyl alcohol, 4-bromobenzyl alcohol, and 4-iodobenzyl alcohol and so on. Also for example, 2-(or 3- or 4-)$C_{1-10}$ straight or branched chain alkyl(e.g., methyl, ethyl, propyl, butyl, sec-butyl, tert-butyl, pentyl, hexyl, heptyl, and the like etc)benzyl alcohol as used herein means, for example, 2-methylbenzyl alcohol, 3-ethylbenzyl alcohol, 4-t-butylbenzyl alcohol, and the like etc. Similarly, also for example, 2-(or 3- or 4-)$C_{1-10}$ straight or branched chain alkoxy(e.g., methoxy, ethoxy, propoxy, butoxy, hexyloxy, heptyloxy, and the like etc)-alpha-methylbenzyl alcohol as used herein means, for example, 2-methoxybenzyl alcohol, 3-ethoxybenzyl alcohol, 4-butyloxybenzyl alcohol, 4-hexyloxybenzyl alcohol, and the like etc. The same nomenclature is used in the rest of this specification and claims.

2. First convert alginic acid or alginic acid derivatives to quaternary ammonium salts and then react those salts with alkylating agents in a suitable organic solvent. Examples of alkylating agents include halo(chloro, fluoro, bromo, iodo)benzene, 2-halo(chloro, fluoro, bromo, iodo)$C_{1-10}$ straight or branched chain alkyl(e.g., methyl, ethyl, propyl, butyl, sec-butyl, tert-butyl, pentyl, hexyl, heptyl, and the like etc)benzene, benzyl halide(chloride, fluoride, iodide, bromide), (2-halo(chloro, fluoro, bromo, iodo)$C_{1-10}$ straight or branched chain alkyl(e.g., methyl, ethyl, propyl, butyl, sec-butyl, tert-butyl, pentyl, hexyl, heptyl, and the like etc))benzene, 2-(halo(chloro, fluoro, bromo, iodo)methyl)naphthalene, 2,5-di$C_{1-10}$ straight or branched chain alkyl(e.g., methyl, ethyl, propyl, butyl, sec-butyl, tert-butyl, pentyl, hexyl, heptyl, and the like etc)benzyl chloride, 4-(halo(chloro, fluoro, bromo, iodo) $C_{1-10}$ straight or branched chain alkyl(e.g., methyl, ethyl, propyl, butyl, sec-butyl, tert-butyl, pentyl, hexyl, heptyl, and the like etc))biphenyl, 9-(halo(chloro, fluoro, bromo, iodo)$C_{1-10}$ straight or branched chain alkyl(e.g., methyl, ethyl, propyl, butyl, sec-butyl, tert-butyl, pentyl, hexyl, heptyl, and the like etc))anthracene, alpha-halo(chloro, fluoro, bromo, iodo)-(o- or m- or p-)xylene, halo(chloro, fluoro, bromo, iodo)toluene, 4-$C_{1-10}$ straight or branched chain alkyl(e.g., methyl, ethyl, propyl, butyl, sec-butyl, tert-butyl, pentyl, hexyl, heptyl, and the like etc)benzyl halide(chloride, fluoride, iodide, bromide), 2,6-di$C_{1-10}$ straight or branched chain alkyl(e.g., methyl, ethyl, propyl, butyl, sec-butyl, tert-butyl, pentyl, hexyl, heptyl, and the like etc)benzyl halide (chloride, fluoride, bromide, iodide), halo(chloro, fluoro, bromo, iodo)diphenylmethane, 1-(or 2-)halo(chloro, fluoro, bromo, iodo)naphthalene, halo(chloro, fluoro, bromo, iodo)fluorene, halo(chloro, fluoro, bromo, iodo)anthracene, halo(chloro, fluoro, bromo, iodo)phenanthrene, etc.

3. Reaction of COOH groups with aromatic oxides. Examples of aromatic oxides include: styrene oxide, 1,2-epoxy-phenoxypropane, glycidyl-2-methylphenyl ether, (2,3-epoxypropyl)benzene, 1-phenylpropylene oxide, stilbene oxide, 2-(or 3- or 4-)halo(chloro, fluoro, bromo, iodo) stilbene oxide, benzyl glycidyl ether, $C_{1-10}$ straight or branched chain alkyl(e.g., methyl, ethyl, propyl, butyl, sec-butyl, tert-butyl, pentyl, hexyl, heptyl, and the like etc)phenyl glycidyl ether, 4-halo(chloro, fluoro, bromo, iodo)phenyl glycidyl ether, glycidyl 4-$C_{1-10}$ straight or branched chain alkoxy(e.g., methoxy, ethoxy, propoxy, butoxy, hexyloxy, heptyloxy, and the like etc) phenyl ether, 2,6-dihalo(chloro, fluoro, bromo, iodo)benzylmethyl ether, 3,4-dibenzyloxybenzyl halide (chloride, fluoride, bromide, iodide), 2-(or 4-)methoxybiphenyl, 3,3'-(or 4,4'-)di$C_{1-10}$ straight or branched chain alkoxy (e.g., methoxy, ethoxy, propoxy, butoxy, hexyloxy, heptyloxy, and the like etc)biphenyl, 4,4'-dimethoxyoctafluorobiphenyl, 1-(or 2-)$C_{1-10}$ straight or branched chain alkoxy(e.g., methoxy, ethoxy, propoxy, butoxy, hexyloxy, heptyloxy, and the like etc)naphthalene, 2-halo(chloro, fluoro, bromo, iodo)-6-methoxynaphthalene, 2,6-di$C_{1-10}$ straight or branched chain alkoxy(e.g., methoxy, ethoxy, propoxy, butoxy, hexyloxy, heptyloxy, and the like etc) naphthalene, 2,7-di$C_{1-10}$ straight or branched chain alkoxy(e.g., methoxy, ethoxy, propoxy, butoxy, hexyloxy, heptyloxy, and the like etc)naphthalene, 1,2,3,4,5,6-hexahalo(chloro, fluoro, bromo, iodo)-7-$C_{1-10}$ straight or branched chain alkoxy(e.g., methoxy, ethoxy, propoxy, butoxy, hexyloxy, heptyloxy, and the like etc)naphthalene, 9,10-bis(4-$C_{1-10}$ straight or branched chain alkoxy(e.g., methoxy, ethoxy, propoxy, butoxy, hexyloxy, heptyloxy, and the like etc)phenyl)-anthracene, 2-$C_{1-10}$ straight or branched chain alkyl(e.g., methyl, ethyl, propyl, butyl, sec-butyl, tert-butyl, pentyl, hexyl, heptyl, and the like etc)-9,10-di$C_{1-10}$ straight or branched chain alkoxy(e.g., methoxy, ethoxy, propoxy, butoxy, hexyloxy, heptyloxy, and the like etc)anthracene, 9,10-bis(4-$C_{1-10}$ straight or branched chain alkoxy(e.g., methoxy, ethoxy, propoxy, butoxy, hexyloxy, heptyloxy, and the like etc)phenyl)-2-halo(chloro, fluoro, bromo, iodo)-anthracene, 2,3,6,7,10,11-hexamethoxytriphenylene, glycidyl-3-(pentadecadienyl)phenyl ether, 4-t-butylphenylglycidyl ether, triphenylolmethane triglycidyl ether, [(4-(1-heptyl-8-[3-(oxiranylmethoxy)phenyl]-octyl)phenoxy)methyl]oxirane, tetraphenylolethane tetraglycidyl ether, hydroxyphenol diglycidyl ether, etc.

4. Reaction of OH groups with aromatic anhydrides. Examples of aromatic anhydrides include phthalic anhydride, 1,8-naphthalic anhydride, benzoic anhydride, phenylsuccinic anhydride, 1-naphthylacetic anhydride, phenylmaleic anhydride, 2,3-diphenylmaleic anhydride, 2-phenylglutaric anhydride, homophthalic anhydride, isatoic anhydride, N-methylisatoic anhydride, 5-halo(chloro, fluoro, bromo, iodo)isatoic anhydride, 3,3',4,4'-benzophenonetetracarboxylic dianhydride, 4-methylphthalic anhydride, 4,4'-(hexahaloisopropylidene)diphthalic anhydride, dihalo(chloro, fluoro, bromo, iodo)phthalic anhydride, tetrahalo(chloro, fluoro, bromo, iodo)phthalic anhydride, 3-hydroxyphthalic anhydride, 1,2,4-benzenetricarboxylic anhydride, 3-(or 4-)nitrophthalic anhydride, 1,2,4,5-benzenetetracarboxylic anhydride, diphenic anhydride, 4-halo(chloro, fluoro, bromo, iodo)-1,8-naphthalic anhydride, 3-(or 4-)nitro-1,8-naphthalic anhydride, 3-(or 4-)amino-1,8-naphthalic anhydride, 1,4,5,8-naphthalenetetracarboxylic dianhydride, 3,4,9,10-perylenetetracarboxylic dianhydride, etc.

5. Reaction of OH groups with aromatic acid halides. Examples of aromatic acid halides include: phenylacetyl halide(chloride, bromide, fluoride, iodide), 4-biphenylcarbonyl halide(chloride, bromide, fluoride, iodide), phenoxyacetyl halide(chloride, fluoride, iodide, bromide), benzoyl halide(chloride, bromide, fluoride, iodide), 1-(or 2-)naphthoyl halide(chloride, fluoride, iodide, bromide), hydroxycinnamoyl halide(chloride, fluoride, iodide, bromide), 2-phenyl-1-cyclopropanecarbonyl halide(chloride, fluoride, iodide, bromide), diphenylacetyl halide(chloride, fluoride, iodide, bromide), 2-halo(chloro, fluoro, iodo, bromo)-2-phenylacetyl halide(chloride, fluoride, iodide, bromide), 2-halo(chloro, fluoro, iodo, bromo)-2,2-diphenylacetyl halide(chloride, fluoride, iodide, bromide), alpha-methoxy-alpha-(trifluoromethyl)phenylacetyl halide(chloride, fluoride, iodide, bromide), benzyloxyacetyl halide(chloride, fluoride, iodide, bromide), O-acetylmandelic halide(chloride, fluoride, iodide, bromide), 3-(or 4-)methoxyphenylacetyl halide(chloride, fluoride, iodide, bromide), 4-halo(chloro, fluoro, bromo, iodo)phenoxyacetyl halide(chloride, fluoride, iodide, bromide), 2,5-diemthoxyphenylacetyl halide(chloride, fluoride, iodide, bromide), 3,4-dimethoxyphenylacetyl halide (chloride, fluoride, iodide, bromide), 9-fluorenylmethylhalo(chloro, fluoro, bromo, iodo)formate, 1-(9-fluorenyl)ethylhalo(chloro, fluoro, bromo, iodo)formate, (phenylthio)acetyl halide(chloride, fluoride, iodide, bromide), cinnamoyl halide(chloride, fluoride, iodide, bromide), 3-(trifluoromethyl)cinnamoyl halide(chloride, fluoride, iodide, bromide), 4-nitrocinnamoyl halide(chloride, fluoride, iodide, bromide), o- or m- or p-toluoyl halide(chloride, fluoride, iodide, bromide), 2-(or 3- or 4-)halo(chloro, fluoro, bromo, iodo) benzoyl halide(chloride, fluoride, iodide, bromide), 2-(or 3- or 4-)nitrobenzoyl halide(chloride, fluoride, iodide, bromide), acetylsalicyloyl halide(chloride, fluoride, iodide, bromide), 2-(or 3- or 4-)(trifluoromethyl)benzoyl halide(chloride, fluoride, iodide, bromide), 2-(or 3- or 4-)(halo(chloro, fluoro, bromo, iodo)methyl)benzoyl halide(chloride, fluoride, iodide, bromide), 2-(or 3- or 4-)(dihalo(chloro, fluoro, bromo, iodo)methyl)benzoyl halide(chloride, fluoride, iodide, bromide), o- or m- or p-anisoyl halide(chloride, fluoride, iodide, bromide), 2-(or 3- or 4-)$C_{2-10}$ straight or branched chain alkyl(e.g., ethyl, propyl, butyl, sec-butyl, tert-butyl, pentyl, hexyl, heptyl, and the like etc)benzoyl halide(chloride, fluoride, iodide, bromide), 2- or 3- or 4-$C_{1-10}$ straight or branched chain alkoxy(e.g., methoxy, ethoxy, propoxy, butoxy, hexyloxy, heptyloxy, and the like etc)benzoyl halide(chloride, fluoride, iodide, bromide), 2-(or 3- or 4-)cyanobenzoyl halide(chloride, fluoride, iodide, bromide), 2,6-dihalo(chloro, fluoro, bromo, iodo)benzoyl halide(chloride, fluoride, iodide, bromide), 2,3-dihalo(chloro, fluoro, bromo, iodo)benzoyl halide(chloride, fluoride, iodide, bromide), 2,4-dihalo(chloro, fluoro, bromo, iodo)benzoyl halide(chloride, fluoride, iodide, bromide), 2,5-dihalo(chloro, fluoro, bromo, iodo)benzoyl halide(chloride, fluoride, iodide, bromide), 3,4-dihalo(chloro, fluoro, bromo, iodo)benzoyl halide(chloride, fluoride, iodide, bromide), 2,6-di$C_{1-10}$ straight or branched chain alkoxy (e.g., methoxy, ethoxy, propoxy, butoxy, hexyloxy, heptyloxy, and the like etc)benzoyl halide(chloride, fluoride, iodide, bromide), 2,3- di$C_{1-10}$ straight or branched chain alkoxy(e.g., methoxy, ethoxy, propoxy, butoxy, hexyloxy, heptyloxy, and the like etc)benzoyl halide(chloride, fluoride, iodide, bromide), 2,4-diC$_{1-10}$ straight or branched chain alkoxy(e.g., methoxy, ethoxy, propoxy, butoxy, hexyloxy, heptyloxy, and the like etc)benzoyl halide(chloride, fluoride, iodide, bromide), 2,5-diC$_{1-10}$ straight or branched chain alkoxy(e.g., methoxy, ethoxy, propoxy, butoxy, hexyloxy, heptyloxy, and the like etc)benzoyl halide(chloride, fluoride, iodide, bromide), 3,4-diC$_{1-10}$ straight or branched chain alkoxy(e.g., methoxy, ethoxy, propoxy, butoxy, hexyloxy, heptyloxy, and the like etc) benzoyl halide(chloride, fluoride, iodide, bromide), 2,6-bis(trifluoromethyl)benzoyl halide(chloride, fluoride, iodide, bromide), 2,3-bis(trifluoromethyl)benzoyl halide (chloride, fluoride, iodide, bromide), 2,4-bis(trifluoromethyl)benzoyl halide(chloride, fluoride, iodide, bromide), 2,5-bis(trifluoromethyl)benzoyl halide(chloride, fluoride, iodide, bromide), 3,4-bis(trifluoromethyl)benzoyl halide (chloride, fluoride, iodide, bromide), 2,3,4,5-tetrahalo (chloro, fluoro, bromo, iodo)benzoyl halide(chloride, fluoride, iodide, bromide), benzoyl halo(chloro, fluoro, bromo, iodo)formate, o- or m- or p-tolyl halo(chloro, fluoro, bromo, iodo) formate, 2-(or 3- or 4-)halo(chloro, fluoro, bromo, iodo)phenyl halo(chloro, fluoro, bromo, iodo)formate, 2-(or 3- or 4-)C$_{1-10}$ straight or branched chain alkoxy(e.g., methoxy, ethoxy, propoxy, butoxy, hexyloxy, heptyloxy, and the like etc) halo(chloro, fluoro, bromo, iodo)formate, etc.

Depending on the types of dye-attaching reactions, suitable dye-containing reagents include aromatic oxides, alkylating agents, aromatic alcohols, aromatic anhydrides, aromatic acid halides, substituted imides; and the like such as those listed above. Further examples of aromatic oxides, alkylating agents, aromatic alcohols, aromatic anhydrides, and aromatic acid halides can be found, for example, in Aldrich Structure Index, 1996–1997 ed, published by Sigma-Aldrich Corp. St. Louis, Mo.

Other than dye-coupling reactions mentioned above, alginic acid may have to be modified by non-dye reagents using the same reactions listed above. This is usually done to increase the non-aqueous solvent solubility of the alginic acid. For example, reaction of OH groups on the polymer with acetic anhydride can make the modified polymer soluble in common casting organic solvents.

Dye-coupling reactions and reactions involving non-dye reagents can be carried out simultaneously, or in most cases separately.

The modified alginic acid or alginic acid derivatives polymers will still retain a certain amount of COOH and/or OH groups so that it can further react with crosslinking groups. This can be achieved by controlling reaction degree because all reactions consume native crosslinking groups on alginic acid or alginic acid derivatives. For some reactions, for example, reaction with oxides, new crosslinking groups are regenerated. In this case, there will always be sufficient crosslinking groups on the final polymers, regardless of reaction degree.

Since alginic acid and/or its derivatives used in this invention as starting materials usually have high molecular weights, reducing molecular weight is needed in most cases. Molecular weight reduction can be achieved by common methods known to those of ordinary skill in the art and which are typically used in polysaccharides, for example, oxidative degradation, thermal degradation, enzyme degradation, etc.

Crosslinking Agent

The composition of the present invention is cured on the semiconductor substrate by the application of heat. Heating induces a crosslinking reaction between the residual hydroxyl and/or carboxy substituents on the alginic acid or alginic acid derivatives and the crosslinking agent. The resulting structure is highly solvent-resistant and impervious to the interdiffusion of photoresist components. Such curing processes are well known from the prior art.

Crosslinking agents are those agents which are capable of forming a crosslinked structure under the action of an acid. Some examples of crosslinking agents include aminoplasts such as, for example, glycoluril-formaldehyde resins, melamine-formaldehyde resins, benzoguanamine-formaldehyde resins, and urea-formaldehyde resins. The use of methylated and/or butylated forms of these resins is highly preferred for obtaining long storage life (3–12 months) in catalyzed form. Highly methylated melamine-formaldehyde resins having degrees of polymerization less than two are useful. Monomeric, methylated glycoluril-formaldehyde resins are useful for preparing thermosetting polyester antireflective coatings which can be used in conjunction with acid-sensitive photoresists. One example is N,N,N,N-tetra (alkoxymethyl)glycoluril. Examples of N,N,N,N-tetra (alkoxymethyl)glycoluril, may include, e.g., N,N,N,N-tetra (methoxymethyl)glycoluril, N,N,N,N-tetra(ethoxymethyl) glycoluril, N,N,N,N-tetra(n-propoxymethyl)glycoluril, N,N, N,N-tetra(i-propoxymethyl)glycoluril, N,N,N,N-tetra(n-butoxymethyl)glycoluril and N,N,N,N-tetra(t-butoxymethyl)glycoluril. N,N,N,N-tetra(methoxymethyl) glycoluril is available under the trademark POWDERLINK from Cytec Industries (e.g., POWDERLINK 1174). Other examples include methylpropyltetramethoxymethyl glycoluril, and methylphenyltetramethoxymethyl glycoluril.

Other aminoplast crosslinking agents are commercially available from Cytec Industries under the trademark CYMEL and from Monsanto Chemical Co. under the trademark RESIMENE. Condensation products of other amines and amides can also be employed, for example, aldehyde condensates of triazines, diazines, diazoles, guanidines, guanimines and alkyl- and aryl-substituted derivatives of such compounds, including alkyl- and aryl-substituted melamines. Some examples of such compounds are N,N'-dimethyl urea, benzourea, dicyandiamide, formaguanamine, acetoguanamine, ammeline, 2-chloro-4,6-diamino-1,3,5-triazine, 6-methyl-2,4-diamino, 1,3,5-traizine, 3,5-diaminotriazole, triaminopyrimidine, 2-mercapto-4,6-diaminopyrimidine, 3,4,6-tris(ethylamino)-1,3,5-triazine, tris (alkoxycarbonylamino)triazine, N,N,N',N'-tetramethoxymethylurea and the like.

Other possible crosslinking agents include: 2,6-bis(hydroxymethyl)-p-cresol and compounds having the following structures:

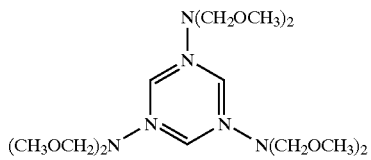

-continued

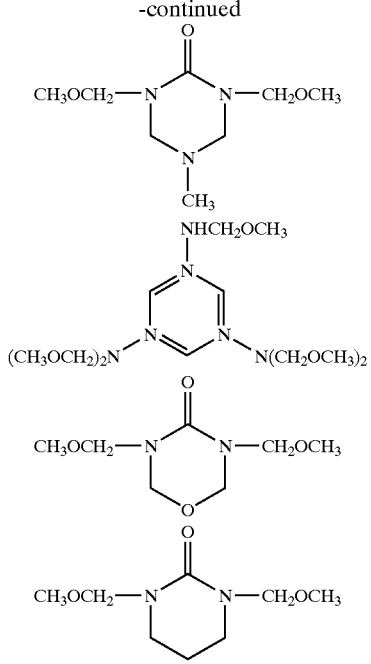

including their analogs and derivatives, such as those found in Japanese Laid-Open Patent Application (Kokai) No. 1-293339 to Tosoh, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547 to Ciba Specialty Chemicals. Other examples include, for example, N,N,N,N-tetrahydroxymethylglycoluril, 2,6-dihydroxymethyl-p-cresol, 2,6-dihydroxymethylphenol, 2,2',6,6'-tetrahydroxymethyl-bisphenol A, 1,4-bis[2-(2-hydroxypropyl)] benzene, and the like, etc. Other examples of crosslinking agents include those described in U.S. Pat. Nos. 4,581,321, 4,889,789, and DE-A 36 34 371, the contents of which are incorporated by reference. Various melamine and urea resins are commercially available under the Nicalacs (Sanwa Chemical Co.), Plastopal (BASF AG), or Maprenal (Clariant GmbH) tradenames.

Isocyanates can also be used as crosslinking agent and their use, structure and synthesis are well known to those of ordinary skill in the art. Examples of isocyanate crosslinking agents can be found in U.S. Pat. No. 5,733,714, the contents of which are hereby incorporated by reference.

Other crosslinking agents include a compound of the formula

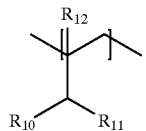

where $R_{10}$ and $R_{11}$ are each independently optionally substituted $C_{1-10}$ alkoxy; and $R_{12}$ is hydrogen or alkyl. This compound is described in U.S. Pat. No. 6,489,432, the contents of which are hereby incorporated herein by reference.

Yet another crosslinking agent includes compounds found in U.S. Pat. No. 6,319,654, the contents of which are hereby incorporated herein by reference. Examples of these compounds include:

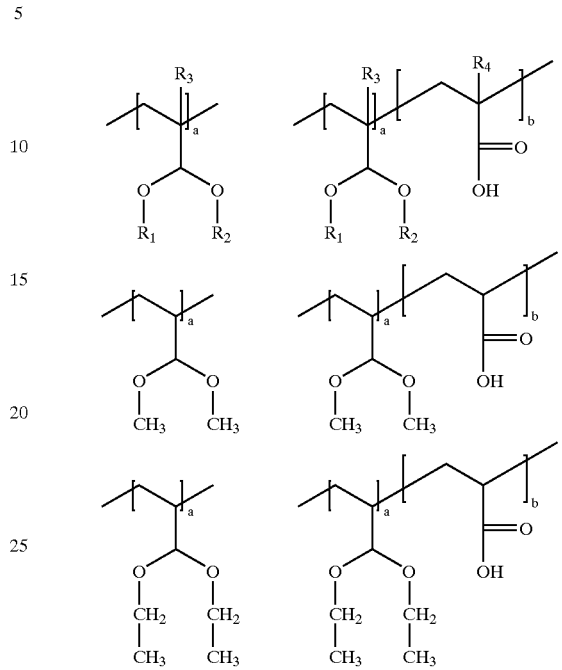

wherein, $R_1$ and $R_2$ individually represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and $R_3$ represents hydrogen or methyl; $R_4$ represents hydrogen or methyl; and a and b individually represent the relative amounts of each comonomer and each is a positive integer greater than 0.

Other examples found in U.S. Pat. No. 6,319,654 include

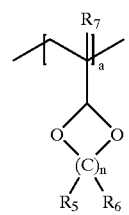

wherein, $R_5$, $R_6$ and R individually represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; $R_7$ represents hydrogen or methyl; m represents 0 or 1; a is a positive integer greater than 0; and n represents a number of 1 to 5.

The crosslinkers can be used individually or in mixtures with each other. The crosslinking agent is added to the composition in a proportion which provides from about 0.10 to about 2.00 equivalents, preferably from about 0.50 to about 1.50, of crosslinking function per reactive group on the alginic acid or alginic acid derivatives modified with a light-absorbing compound.

Other optional materials known to those skilled in the art, for example, cross-linking catalysts (for example, thermal acid generators, acids, and mixtures thereof), solvents, surfactants, solvent soluble dyes, and the like can be optionally added to compositions of the present invention.

Cross-linking catalysts include, for example, thermal acid generators, acids, and mixtures thereof. A thermal acid generator is a compound which is not an acid but which is converted to an acid upon heating of the photoresist film. Suitable thermal acid generators useful in the present invention include the ammonium salts of acids where the corresponding amine is volatile. Ammonium salts of acids are prepared by neutralizing an acid with ammonia or an amine. The amine may be a primary, secondary or tertiary amine. The amine must be volatile since it must evaporate from the anti-reflective film upon heating to the temperature required to crosslink the film. When the amine or ammonia evaporates from the anti-reflective film upon heating it leaves an acid in the film. This acid is then present in the anti-reflective film and is employed to catalyze the acid hardening crosslinking reaction upon heating, unless it becomes neutralized by a corresponding amount of a base.

Examples of thermal acid generators include benzoin tosylate, 2-nitrobenzyl tosylate, tris(2,3-dibromopropyl)-1,3,5-triazine-2,4,6-trione, the alkyl esters of organic sulfonic acids, p-toluenesulfonic acid, dodecylbenzenesulfonic acid, oxalic acid, phthalic acid, phosphoric acid, camphorsulfonic acid, their salts, and mixtures thereof. When benzoin tosylate is heated toluene sulfonic acid is produced by a substitution reaction. Alkyl sulfonates which produce the sulfonic acid by elimination upon heating are examples of other thermal acid generators.

Examples of acids which can be used include the non-salts of the above thermal acid generators and include, for example, organic acids such as sulfonic acids (for example, aromatic sulfonic acids such as phenylsulfonic acid and para-toluenesulfonic acid). One or more cross-linking catalysts can be used in the composition.

Examples of solvents for the coating composition comprising the modified alginic acid or alginic acid derivatives of the present invention include alcohols, esters, glymes, ethers, glycol ethers, glycol ether esters, ketones, cyclic ketones, and their admixtures. Examples of such solvents include, but are not limited to, propylene glycol methyl ether, propylene glycol methyl ether acetate, cyclohexanone, 2-heptanone, ethyl 3-ethoxy-propionate, propylene glycol methyl ether acetate, ethyl lactate, and methyl 3-methoxypropionate. The solvent is typically present in an amount of from about 40 to about 95 weight percent.

Since the composition is coated on top of the substrate and is further subjected to dry etching, it is envisioned that the composition is of sufficiently low metal ion level and purity that the properties of the semiconductor device are not adversely affected. Treatments such as passing a solution of the modified alginic acid or alginic acid derivatives, or compositions containing such modified alginic acid or alginic acid derivatives, through an ion exchange column, filtration, and extraction processes can be used to reduce the concentration of metal ions and to reduce particles.

The coating composition can be coated on the substrate using techniques well known to those skilled in the art, such as dipping, spincoating or spraying. The film thickness of the anti-reflective coating ranges from about 0.01 $\mu$m to about 1 $\mu$m. The coating can be heated on a hot plate or convection oven or other well known heating methods to remove any residual solvent and induce crosslinking if desired, and insolubilizing the anti-reflective coatings to prevent intermixing between the anti-reflective coating and the photoresist.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Negative working photoresist and positive working photoresist compositions and their use are well known to those skilled in the art.

A process of the instant invention comprises coating a substrate with a coating composition comprising the modified alginic acid or alginic acid derivatives of the present invention and heating the substrate on a hotplate or convection oven or other well known heating methods at a sufficient temperature for sufficient length of time to remove the coating solvent, and crosslink the polymer if necessary, to a sufficient extent so that the coating is not soluble in the coating solution of a photoresist or in a aqueous alkaline developer. An edge bead remover may be applied to clean the edges of the substrate using processes well known in the art. The heating ranges in temperature from about 70° C. to about 250° C. If the temperature is below 70° C. then insufficient loss of solvent or insufficient amount of crosslinking may take place, and at temperatures above 250° C., the polymer may become chemically unstable. A film of a photoresist composition is then coated on top of the anti-reflective coating and baked to substantially remove the photoresist solvent. The photoresist is image-wise exposed and developed in an aqueous developer to remove the treated resist. An optional heating step can be incorporated into the process prior to development and after exposure. The process of coating and imaging photoresists is well known to those skilled in the art and is optimized for the specific type of resist used. The patterned substrate can then be dry etched in a suitable etch chamber to remove the exposed portions of the anti-reflective film, with the remaining photoresist acting as an etch mask.

The following examples provide illustrations of the methods of producing and utilizing the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLE 1

(A) 200 grams of alginic acid (ISP Corp.) was dispersed in a large amount of deionized water (~3 liters) with stirring for about thirty minutes at room temperature. The dispersion was then filtered. The remaining solids were then placed in a suitably sized beaker and a sufficient amount of acetone was added to form a slurry. The slurry was stirred for about thirty minutes and then filtered. The remaining solids were then placed into a suitably sized beaker and a sufficient amount of acetic acid was added to form a slurry. The slurry was stirred for about thirty minutes and then filtered. The acetic acid slurry process was repeated once more. The remaining solids (after filtering) were placed into a 3 liter jacketed flask which was fitted with a stirrer and thermometer. 700 ml acetic acid and 1300 ml acetic anhydride were added to the flask with stirring. The flask was cooled to about 5° C. 8 grams of 98% $H_2SO_4$ was then added to the flask. The temperature of the flask was then allowed to reach room temperature (RT, ~25° C.). The temperature of the flask was then raised to about 60° C. and the contents of the flask were maintained at this temperature, with stirring, for about 1 hour. Then the temperature of the flask was reduced to RT and filtered. The remaining solids were then slurried in acetone/filtered four times. The solids remaining after the fourth filtering were then placed in a filter press and blown dry with a gentle nitrogen stream. The resulting filter cake was placed in a blender and ground to a fine powder (188 grams). The polymer was acetyl alginate.

(B) 50 grams of the fine powder obtained above in (A) was suspended in 450 grams of ethyl lactate in a suitably sized jacketed flask (fitted with a stirrer and thermometer). 4.87 grams of triethylamine and 10 grams of deionzied water were added and the resulting mixture was stirred for about 30 minutes at RT. 4 grams of benzyltriethylammonium chloride was then added, followed by 100 grams of styrene oxide. The contents of the flask were then raised to about 85° C. and stirred at this temperature for 2 hours. The temperature was then reduced to about 75° C. 100 grams of propylene oxide were added to the mixture and stirred for about 1 hour at 75° C. 25 grams of hydrogen peroxide (50%) was then added to the mixture and the mixture was stirred for another 2 hours at 75° C. The mixture was then cooled to RT and filtered. The filtrate was slowly poured into large amount of water to precipitate the polymer. The polymer was filtered, washed thoroughly with water and dried in a vacuum oven (50 grams obtained). The polymer obtained had a weight average molecular weight of about 60,000 g/mol and a polydispersity of 3.0.

(C) An anti-reflective coating composition was prepared by dissolving 2.4 g of the above polymer from (B), 0.60 g of tetramethoxymethyl glycoluril, and 0.048 g triethylammonium salt of 10-camphorsulfonic acid in 77.6 g ethyl lactate. The solution was filtered through a 0.2 $\mu$m filter.

(D) The performance of the anti-reflective coating formulation of (C) was evaluated using AZ® EXP AX1020P photoresist (available from AZ Electronic Materials, Clariant Corporation, Somerville, N.J.). A 78 nm anti-reflective film of the above composition (C) was coated on a silicon wafer and baked at 200° C. for 90 seconds. The anti-reflective film was found to have an (n) value of 1.82 and a (k) value of 0.35. Using AZ® EXP AX1020P photoresist a 330 nm film was coated and baked at 115° C. for 60 seconds. The wafer was then imagewise exposed using an ISI 193 nm ministepper with 0.6NA, 0.7 sigma, under conventional illumination with a binary mask. The exposed wafer was baked at 110° C. for 60 seconds and developed using a 2.38 wt % aqueous solution of tetramethyl ammonium hydroxide for 60 seconds. At an exposure dose of 16 mJ/cm$^2$, the line and space patterns at 0.13 micron were observed under scanning electron microscope and showed no standing waves, indicating the efficacy of the bottom anti-reflective coating.

EXAMPLE 2

(E) 50 grams of acetyl alginate prepared in Example 1 ((A)) was suspended in 450 grams of ethyl lactate in a suitably sized jacketed flask (fitted with a stirrer and thermometer). 4.87 grams of triethylamine and 10 grams of deionzied water were added and the resulting mixture was stirred for about 30 minutes at RT. 4 grams of benzyltriethylammonium chloride was then added, followed by 100 grams of 1,2-epoxy-3-phenoxypropane. The contents of the flask were then raised to about 85° C. and stirred at this temperature for 2 hours. The temperature was then reduced to about 75° C. 100 grams of propylene oxide were added to the mixture and stirred for about 1 hour at 75° C. 25 grams of hydrogen peroxide (50%) was then added to the mixture and the mixture was stirred for another 2 hours at 75° C. The mixture was then cooled to RT and filtered. The filtrate was slowly poured into large amount of water to precipitate the polymer. The polymer was filtered, washed thoroughly with water and dried in a vacuum oven (50 grams obtained). The polymer obtained had a weight average molecular weight of about 75,000 g/mol and a polydispersity of 3.5.

(F) An anti-reflective coating composition was prepared by dissolving 2.4 g of the above polymer of (E), 0.60 g of N,N,N,N-tetra(methoxymethyl)glycoluril, and 0.048 g triethylammonium salt of 10-camphorsulfonic acid in 77.6 g ethyl lactate. The solution was filtered through a 0.2 $\mu$m filter.

(G) The performance of the anti-reflective coating formulation of (F) was evaluated using AZ® EXP AX1020P photoresist (available from AZ Electronic Materials, Clariant Corporation, Somerville, N.J.). An 88 nm anti-reflective film of the above composition (F) was coated on a silicon wafer and baked at 200° C. for 90 seconds. The anti-reflective film was found to have an (n) value of 1.70 and a (k) value of 0.36. Using AZ® EXP AX1020P photoresist a 330 nm film was coated and baked at 115° C. for 60 seconds. The wafer was then imagewise exposed using an ISI 193 nm ministepper with 0.6NA, 0.7 sigma, under conventional illumination with a binary mask. The exposed wafer was baked at 110° C. for 60 seconds and developed using a 2.38 wt % aqueous solution of tetramethyl ammonium hydroxide for 60 seconds. At an exposure dose of 16 mJ/cm$^2$, the line and space patterns at 0.13 micron were observed under scanning electron microscope and showed no standing waves, indicating the efficacy of the bottom anti-reflective coating.

EXAMPLE 3

(H) 50 grams of acetyl alginate prepared in Example 1 ((A)) was suspended in 450 grams of ethyl lactate in a suitably sized jacketed flask (fitted with a stirrer and thermometer). 4.87 grams of triethylamine and 10 grams of deionzied water were added and the resulting mixture was stirred for about 30 minutes at RT. 4 grams of benzyltriethylammonium chloride was then added, followed by 100 grams of styrene oxide. The contents of the flask were then raised to about 85° C. and stirred at this temperature for 2 hours. The temperature was then reduced to about 75° C. 300 grams of propylene oxide were added to the mixture and stirred for about 1 hour at 55° C. 25 grams of hydrogen peroxide (50%) was then added to the mixture and the mixture was stirred for another 24 hours at 55° C. The mixture was then cooled to RT and filtered. The filtrate was slowly poured into large amount of water to precipitate the polymer. The polymer was filtered, washed thoroughly with water and dried in a vacuum oven (50 grams obtained). The polymer obtained had a weight average molecular weight of about 60,000 g/mol and a polydispersity of 3.4.

(I) An anti-reflective coating composition was prepared by dissolving 2.4 g of the above polymer (H), 0.60 g of N,N,N,N-tetra(methoxymethyl)glycoluril, 0.048 g triethylammonium salt of 10-camphorsulfonic acid in 77.6 g ethyl lactate. The solution was filtered through a 0.2 µm filter.

(J) The performance of the anti-reflective coating formulation of (I) was evaluated using AZ® EXP AX1020P photoresist (available from AZ Electronic Materials, Clariant Corporation, Somerville, N.J.). A 78 nm anti-reflective film of the above composition (I) was coated on a silicon wafer and baked at 200° C. for 90 seconds. The anti-reflective film was found to have an (n) value of 1.82 and a (k) value of 0.34. Using AZ® EXP AX1020P photoresist a 330 nm film was coated and baked at 115° C. for 60 seconds. The wafer was then imagewise exposed using an ISI 193 nm ministepper with 0.6NA, 0.7 sigma, under conventional illumination with a binary mask. The exposed wafer was baked at 110° C. for 60 seconds and developed using a 2.38 wt % aqueous solution of tetramethyl ammonium hydroxide for 60 seconds. At an exposure dose of 16 mJ/cm$^2$, the line and space patterns at 0.13 micron were observed under scanning electron microscope and showed no standing waves, indicating the efficacy of the bottom anti-reflective coating.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. Solvent soluble acetyl alginate modified with a light-absorbing compound so as to leave sufficient hydroxyl and/or carboxyl groups on the acetyl alginate for crosslinking with a crosslinking compound wherein the light absorbing compound is an aromatic oxide selected from styrene oxide, 1,2-epoxy-phenoxypropane, glycidyl-2-methylphenyl ether, (2,3-epoxypropyl)benzene, 1-phenylpropylene oxide, stilbene oxide, 2-(or 3- or 4-)halo stilbene oxide, benzyl glycidyl ether, $C_{1-10}$ straight or branched chain alkylphenyl glycidyl ether, 4-halophenyl glycidyl ether, glycidyl 4-$C_{1-10}$ straight or branched chain alkoxyphenyl ether, 2,6-dihalobenzylmethyl ether, 3,4-dibenzyloxybenzyl halide, 2-(or 4-)methoxybiphenyl, 3,3'-(or 4,4'-)di$C_{1-10}$ straight or branched chain alkoxybiphenyl, 4,4'-dimethoxyoctafluorobiphenyl, 1-(or 2-)$C_{1-10}$ straight or branched chain alkoxynaphthalene, 2-halo-6-methoxynaphthalene, 2,6-di$C_{1-10}$ straight or branched chain alkoxynaphthalene, 2,7-di$C_{1-10}$ straight or branched chain alkoxynaphthalene, 1,2,3,4,5,6-hexahalo-7-$C_{1-10}$ straight or branched chain alkoxynaphthalene, 9,10-bis(4-$C_{1-10}$ straight or branched chain alkoxyphenyl)-anthracene, 2-$C_{1-10}$ straight or branched chain alkyl-9,10-di$C_{1-10}$ straight or branched chain alkoxyanthracene, 9,10-bis(4-$C_{1-10}$ straight or branched chain alkoxyphenyl)-2-halo-anthracene, 2,3,6,7,10,11-hexamethoxytriphenylene, glyciclyl-3-(pentadecadienyl)phenyl ether, 4-t-butylphenylglycidyl ether, triphenylolmethane triglycidyl ether, [(4-(1-heptyl-8-[3-(oxiranylmethoxy)phenyl]octyl)phenoxy) methyl]oxirane, tetraphenylolethane tetraglycidyl ether, and hydroxyphenol diglycidyl ether.

2. A composition comprising:
   a) the solvent soluble acetyl alginate modified with a light-absorbing compound of claim 1; and
   b) at least one crosslinking agent.

3. The composition of claim 2 wherein b) the crosslinking agent is selected from aminoplast, isocyanate, a compound selected from

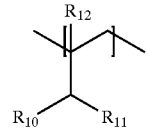

where $R_{10}$ and $R_{11}$ are each independently optionally substituted $C_{1-10}$ alkoxy; and $R_{12}$ is hydrogen or alkyl;

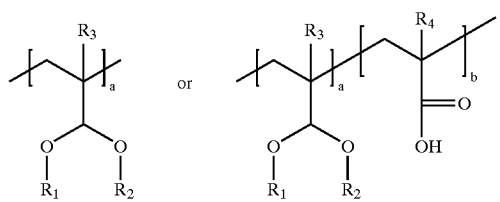

wherein, $R_1$ and $R_2$ individually represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched C$_{1-10}$ ester including at least one hydroxyl group, straight or branched C$_{1-10}$ ketone including at least one hydroxyl group, straight or branched C$_{1-10}$ carboxylic acid including at least one hydroxyl group, and straight or branched C$_{1-10}$ acetal including at least one hydroxyl group; and R$_3$ represents hydrogen or methyl; R$_4$ represents hydrogen or methyl; and a and b individually represent the relative amounts of each comonomer and each is a positive integer greater than 0;

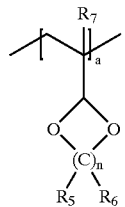

wherein, R$_5$, R$_5$ and R$_7$ individually represent straight or branched C$_{1-10}$ alkyl, straight or branched C$_{1-10}$ ester, straight or branched C$_{1-10}$ ketone, straight or branched C$_{1-10}$ carboxylic acid, straight or branched C$_{1-10}$ acetal, straight or branched C$_{1-10}$ alkyl including at least one hydroxyl group, straight or branched C$_{1-10}$ ester including at least one hydroxyl group, straight or branched C$_{1-10}$ ketone including at least one hydroxyl group, straight or branched C$_{1-10}$ carboxylic acid including at least one hydroxyl group, and straight or branched C$_{1-10}$ acetal including at least one hydroxyl group; R$_7$ represents hydrogen or methyl; a is a positive integer greater than 0; and n represents a number of 1 to 5, or mixtures thereof.

4. The composition of claim 2 wherein b) the crosslinking agent is an aminoplast.

5. The composition of claim 4 wherein b) the crosslinking agent is an aminoplast selected from N,N,N,N-tetra(methoxymethyl)glycoluril, N,N,N,N-tetra(ethoxymethyl)glycoluril, N,N,N,N-tetra(n-propoxymethyl)glycoluril, N,N,N,N-tetra(i-propoxymethyl)glycoluril, N,N,N,N-tetra(n-butoxymethyl)glycoluril and N,N,N,N-tetra(t-butoxymethyl)glycoluril, methylpropyltetramethoxymethyl glycoluril, methylphenyltetramethoxymethyl glycoluril, N,N'-dimethyl urea, benzourea, dicyandiamide, formaguanamine, acetoguanamine, ammeline, 2-chloro-4,6-diamino-1,3,6-triazine, 6-methyl-2,4-diamino, 1,3,5-traizine, 3,5-diaminotriazole, triaminopyrimidine, 2-mercapto-4,6-diamino-pyrimidine, 3,4,6-tris(ethylamino)-1,3,5-triazine, tris(alkoxycarbonylamino)triazine, N,N,N,N-tetrahydroxymethylglycoluril, N,N,N',N'-tetramethoxymethylurea and mixtures thereof.

6. The composition of claim 2 wherein b) the crosslinking agent is an isocyanate.

7. The composition of claim 2 wherein b) the crosslinking agent is a compound selected from

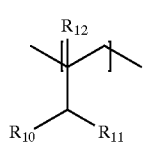

where R$_{10}$ and R$_{11}$ are each independently optionally substituted C$_{1-10}$ alkoxy; and R$_{12}$ is hydrogen or alkyl;

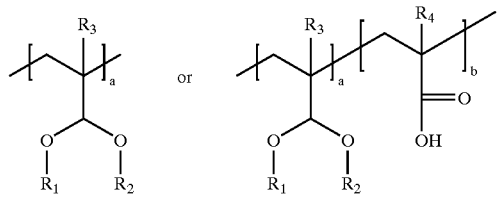

wherein, R$_1$ and R$_2$ individually represent straight or branched C$_{1-10}$ alkyl, straight or branched C$_{1-10}$ ester, straight or branched C$_{1-10}$ ketone, straight or branched C$_{1-10}$ carboxylic acid, straight or branched C$_{1-10}$ acetal, straight or branched C$_{1-10}$ alkyl including at least one hydroxyl group, straight or branched C$_{1-10}$ ester including at least one hydroxyl group, straight or branched C$_{1-10}$ ketone including at least one hydroxyl group, straight or branched C$_{1-10}$ carboxylic acid including at least one hydroxyl group, and straight or branched C$_{1-10}$ acetal including at least one hydroxyl group; and R$_3$ represents hydrogen or methyl; R$_4$ represents hydrogen or methyl; and a and b individually represent the relative amounts of each comonomer and each is a positive integer greater than 0;

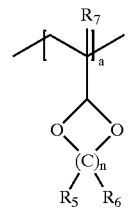

wherein, R$_5$, R$_6$ and R$_7$ individually represent straight or branched C$_{1-10}$ alkyl, straight or branched C$_{1-10}$ ester, straight or branched C$_{1-10}$ ketone, straight or branched C$_{1-10}$ carboxylic acid, straight or branched C$_{1-10}$ acetal, straight or branched C$_{1-10}$ alkyl including at least one hydroxyl group, straight or branched C$_{1-10}$ ester including at least one hydroxyl group, straight or branched C$_{1-10}$ ketone including at least one hydroxyl group, straight or branched C$_{1-10}$ carboxylic acid including at least one hydroxyl group, and straight or branched C$_{1-10}$ acetal including at least one hydroxyl group; R$_7$ represents hydrogen or methyl; a is a positive integer greater than 0; and n represents a number of 1 to 5, or mixtures thereof.

8. The composition of claim 2 further comprising one or more cross-linking catalysts.

9. The composition of claim 8 wherein the cross-linking catalyst is selected from thermal acid generators, acids, and mixtures thereof.

10. The composition of claim 9 wherein the cross-linking catalyst is thermal acid generators.

11. The composition of claim 9 wherein the cross-linking catalyst is selected from acids.

12. The composition of claim 9 wherein the cross-linking catalyst is selected from a mixture of thermal acid generators and acids.

* * * * *